United States Patent [19]
Shih et al.

[11] Patent Number: 5,970,011
[45] Date of Patent: Oct. 19, 1999

[54] POWER SOURCE DESIGN FOR EMBEDDED MEMORY

[75] Inventors: Chian-Gauh Shih, Hsinchu Hsien; Cheng-Ju Hsieh, Kaohsiung; Jaris Yeh, Hsinchu Hsien; Jacob Chen, Hsinchu, all of Taiwan

[73] Assignee: United Microelectronics Corp., Hsinchu, Taiwan

[21] Appl. No.: 09/198,900

[22] Filed: Nov. 23, 1998

[51] Int. Cl.$^6$ .................................................. G11C 7/00
[52] U.S. Cl. .......................... 365/226; 365/63; 365/201
[58] Field of Search ............... 365/63, 201, 226; 327/536

[56] References Cited

U.S. PATENT DOCUMENTS

| | | | |
|---|---|---|---|
| 5,287,320 | 2/1994 | Adachi | 365/226 |
| 5,367,487 | 11/1994 | Yoshida | 365/189.09 |
| 5,828,826 | 10/1998 | Sato et al. | 395/183.06 |
| 5,889,722 | 3/1999 | Numazaki et al. | 365/226 |

*Primary Examiner*—David Nelms
*Assistant Examiner*—Gene N. Auduong
*Attorney, Agent, or Firm*—Hickman Stephens & Coleman

[57] ABSTRACT

A power source design for embedded memory uses independent power sources such that a first power source group is linked to the DRAM, a second power source group is linked to the logic unit and a third power source group is linked to the testing mode circuit with input/output ports during the silicon chip stage. In the packaging stage the first power source group, the second power source group and the third power source group are joined together. The design is able to prevent testing errors or instability due to direct current from floating nodes in the silicon chip testing stage, and prevent a potential latch-up problem in the packaging stage.

12 Claims, 1 Drawing Sheet

POWER SOURCE DESIGN FOR EMBEDDED MEMORY

BACKGROUND OF THE INVENTION

1. Field of Invention

The present invention relates to an embedded memory. More particularly, the present invention relates to the power source design within an embedded memory that can improve testing stability and reduce testing errors.

2. Description of Related Art

The semiconductor industry is forever striving to produce semiconductor devices that have functions superior their competitors' devices while maintaining or lowering the cost of production. Through miniaturization and sub-micron manufacturing technique, many devices can be squeezed into a very small silicon chip. Hence, cost of each device is greatly lowered. In addition, sub-micron technique is capable of forming devices with a variety of different functions within a silicon chip, thereby improving its usefulness.

Another direction in which the semiconductor industry is heading, that can improve cost of production and device functionality, is to form logic devices and memory devices together on a silicon chip. The integration of logic devices and memory devices together on a silicon chip rather than on two separate chips can reduce time delays between devices. In addition, having the logic devices and the memory devices on the same silicon chip can save production cost. This is because some of the separate processing steps necessary for fabricating logic devices and memory devices independently can be combined together.

The structure known as an embedded memory is an example of an integrated circuit (IC) that integrates dynamic random access memory (DRAM) and logic circuitry together in the same semiconductor substrate. The embedded DRAM memory is capable of accessing large quantities of data in a very short time, and hence has many useful applications. For example, microprocessors and digital signal processors are some of the integrated circuits that use embedded memory.

FIG. 1 is a diagram showing the structure of a conventional embedded memory. An embedded memory 10 includes a DRAM 12, a logic unit 14 and a testing mode circuit with input/output ports 16. The DRAM 12, the logic unit 14 and the testing mode circuit with input/output ports 16 all use the same power source Vcc to supply voltage necessary for carrying out various internal functions of the embedded memory 10. However, when the DRAM 12 is undergoing a testing operation, the logic unit 14 may generate direct current internally due to a floating node if the DRAM 12 and the logic unit 14 share the same power source Vcc. Consequently, the testing environment and conditions of the DRAM may be affected leading to testing instability and errors. In addition, the actual amount of current drained by the DRAM or the occurrence of any out-of-range parameters may be difficult to track.

In light of the foregoing, there is a need to provide an improved power source design for the embedded memory.

SUMMARY OF THE INVENTION

Accordingly, the present invention provides an embedded memory having an independent power source for each of the DRAM, the logic unit and the testing mode circuit with input/output ports. Therefore, testing can be carried out by connecting to the independent power source that leads to the specific portion of the silicon chip only, thereby minimizing any interference between the circuits.

To achieve these and other advantages and in accordance with the purpose of the invention, as embodied and broadly described herein, the invention provides a power source design for embedded memory. The embedded memory comprises a DRAM, a logic unit and a testing mode circuit with input/output ports. The design of power source in the embedded memory includes arranging to form a first power source group, a second power source group and a third power source group leading to the DRAM, the logic unit and the testing mode circuit with input/output ports, respectively, during the silicon chip stage, and then joining the first power source group, the second power source group and the third power source group together during the packaging stage.

The main characteristic of this invention is the design of three independent power sources for the embedded memory. That is, the embedded memory has one power source leading to the DRAM circuit, one power source leading to the logic unit and one power source leading to the testing mode circuit with input/output ports. Hence, when the silicon chip undergoes a testing operation, instability of testing errors can be prevented. In addition, the three groups of power sources are connected together after packaging to minimize possible latch-up problems.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
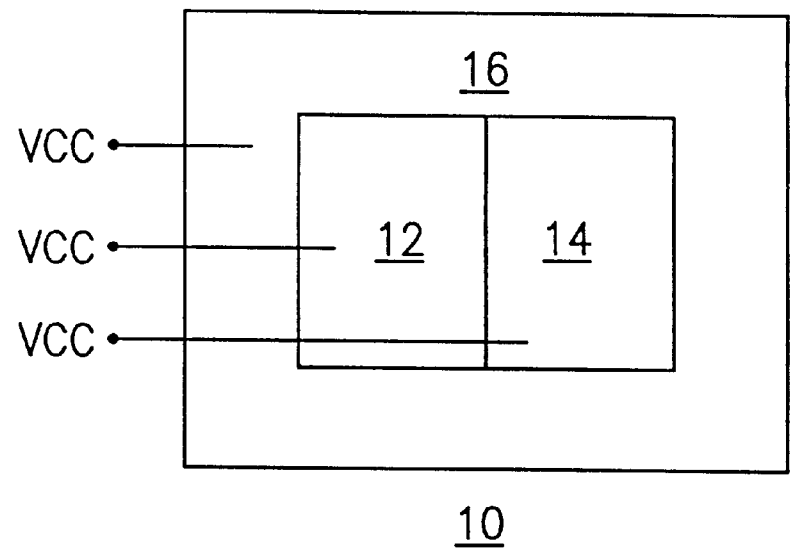
FIG. 1 is a diagram showing the structure of a conventional embedded memory.

Reference will now be made in detail to the present preferred embodiments of the invention, examples of which are illustrated in the accompanying drawings. Wherever possible, the same reference numbers are used in the drawings and the description to refer to the same or like parts.

Figure 2:
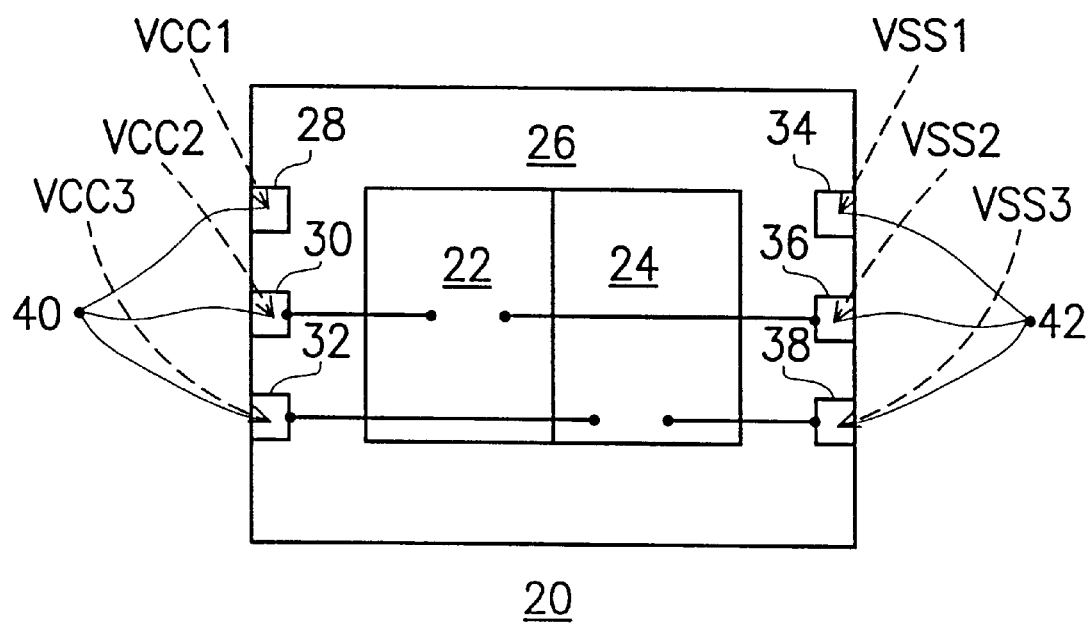
FIG. 2 is a diagram showing the structure of an embedded memory having power sources designed according to this invention.

FIG. 2 is a diagram showing the structure of an embedded memory having power sources designed according to this invention.

The embedded memory 20 as shown in FIG. 2 includes a DRAM 22, a logic unit 24 and a testing mode circuit with input/output ports 26. In addition, power pads 28, 30, 32, 34, 36 and 38 are formed inside the testing mode circuit with input/output ports 26 area. In the silicon chip stage, an independent first power source group (Vcc1 and Vss1) is designed to link up the testing mode circuit with input/output ports 26, an independent second power source group (Vcc2 and Vss2) is designed to link up the logic unit 24, and an independent third power source group (Vcc2 and Vss3) is designed to link up the DRAM 22. The first power source group (Vcc1 and Vss1), the second power source group (Vcc2 and Vss2) and the third power source group (Vcc3 and Vss3) are each composed of a high voltage source and a low voltage source. The low voltage source can be a ground.

When testing of the DRAM 22 is carried out in the silicon chip stage, only the first power source group (Vcc1 and Vss1) and the second power source group (Vcc2 and Vss2) have to be connected. On the other hand, when testing of the logic unit 24 is carried out, only the first power source group (Vcc1 and Vss1) and the third power source group (Vcc3 and Vss3) have to be connected. However, if the entire embedded memory needs to be tested, the first power source group (Vcc1 and Vss1), the second power source group (Vcc2 and Vss2) and the third power source group (Vcc3 and Vss3) must all be connected.

In the packaging stage for the silicon chip, the first power source group (Vcc1 and Vss1), the second power source group (Vcc2 and Vss2) and the third power source group (Vcc3 and Vss3) are connected together. In other words, Vcc1, Vcc2 and Vcc3 are joined together at a node 40, while Vss1, Vss2 and Vss3 are joined together at another node 42 as shown in FIG. 2. Hence, a potential latch-up problem can be prevented.

In summary, the embedded memory in this invention uses separate power sources to avoid mutual interference during the silicon chip stage and joins up various power sources together during the packaging state to prevent latch-up problem.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A power source design for embedded memory, wherein the embedded memory includes a dynamic random access memory (DRAM), a logic unit and a testing mode circuit with input/output ports, comprising:

designing a first power source group linking the DRAM, a second power source group linking the logic unit and a third power source group linking the testing mode circuit with input/output ports during the silicon chip stage; and joining the first power source group, the second power source group and the third power source group during the packaging stage.

2. The power source design of claim 1, wherein each of the first power source group, the second power source group and the third power source group comprises a low voltage source and a high voltage source, respectively.

3. The power source design of claim 1, wherein testing of the DRAM in the silicon stage can be carried out by connecting to the first power source group and the third power source group, only.

4. The power source design of claim 1, wherein testing of the logic unit in the silicon stage can be carried out by connecting to the second power source group and the third power source group, only.

5. The power source design of claim 1, wherein testing of the entire embedded memory in the silicon stage can be carried out by connecting to the first power source group, the second power source group and the third power source group.

6. The power source design of claim 1, wherein the first power source group, the second power source group and the third power source group are connected together externally using a conventional packaging method during the packaging stage.

7. An embedded memory, comprising:

a dynamic random access memory having a first power source group;

a logic unit having a second power source group; and a testing mode circuit with input/output ports having a third power source group, wherein the first power source group, the second power source group and the third power source group are independently connected during the silicon chip stage, while the first power source group, the second power source group and the third power source group are joined together during the packaging stage.

8. The embedded memory of claim 7, wherein each of the first power source group, the second power source group and the third power source group comprises a low voltage source and a high voltage source.

9. The embedded memory power source design of claim 8, wherein the low voltage source includes a ground.

10. The embedded memory of claim 7, wherein testing of the DRAM in the silicon stage can be carried out by connecting to the first power source group and the third power source group, only.

11. The embedded memory of claim 7, wherein testing of the logic unit in the silicon stage can be carried out by connecting to the second power source group and the third power source group, only.

12. The embedded memory of claim 7, wherein testing of the entire embedded memory in the silicon stage can be carried out by connecting to the first power source group, the second power source group and the third power source group.

* * * * *